United States Patent [19]
Kashio et al.

[11] Patent Number: 5,408,050
[45] Date of Patent: Apr. 18, 1995

[54] FLAT CABLE AND METHOD OF MAKING THE SAME

[75] Inventors: Kinji Kashio, Tokyo; Hikaru Mitani, Iwate, both of Japan

[73] Assignees: Honda Tsushin Kogyo Co., Ltd., Tokyo; Tohoku Honda Denshi Co., Ltd., Iwate, both of Japan

[21] Appl. No.: 118,212

[22] Filed: Sep. 9, 1993

[51] Int. Cl.⁶ ............... H01B 7/08; H01B 13/00; H01R 43/00
[52] U.S. Cl. ............... 174/117 F; 29/827; 29/829; 174/117 FF; 174/268
[58] Field of Search ........ 174/117 FF, 117 R, 117 A, 174/117 F, 268; 29/825, 827, 829; 156/52, 55

[56] References Cited

U.S. PATENT DOCUMENTS

| | | | |
|---|---|---|---|
| 243,180 | 6/1881 | Ware | 174/117 F |
| 303,735 | 8/1884 | Jackson | 174/117 FF |
| 3,876,964 | 4/1975 | Balaster et al. | 174/117 PC |
| 4,635,359 | 1/1987 | Nozick | 174/117 FF |
| 4,731,503 | 3/1988 | Kitanishi | 174/117 A |
| 5,206,462 | 4/1993 | Iura et al. | 174/117 F |
| 5,288,950 | 2/1994 | Ushio et al. | 174/268 |

FOREIGN PATENT DOCUMENTS

| | | | |
|---|---|---|---|
| 2643838 | 12/1977 | Germany | 174/117 FF |
| 5-75231 | 3/1993 | Japan | 29/829 |
| 1601000 | 10/1981 | United Kingdom | 174/117 A |
| 1604676 | 12/1981 | United Kingdom | 174/117 A |
| 1695400 | 11/1991 | U.S.S.R. | 174/117 F |

*Primary Examiner*—Morris H. Nimmo
*Attorney, Agent, or Firm*—Nikaido, Marmelstein, Murray & Oram

[57] ABSTRACT

Disclosed is a flat cable having a plurality of parallel-arranged flexible conductor wires and two pieces of insulating tape applied to the opposite center areas of the parallel arrangement of conductor wires leaving their opposite ends exposed, thereby permitting the exposed ends to be used as terminal contacts, each of said conductor wires having an intermediate length of reduced width for increasing the flexibility of the conductor wire. An elongated strip of electrically conductive, flexible metal foil is unrolled and fed to be punched to provide at one time, conductor wires of the same number and parallel arrangement as a flat cable to be made; two pieces of adhesive, insulating tape are applied to the center areas of the parallel conductor wire arrangement; and finally the opposite perforation edges are cut and removed.

2 Claims, 4 Drawing Sheets

FLAT CABLE AND METHOD OF MAKING THE SAME

BACKGROUND OF THE INVENTION

1. Field of the Invention

The present invention relates to an improved flexible flat cable which is used for instance in connecting electric or electronic devices, and to a method of making such flat cable.

2. Description of Related Art

Referring to FIGS. 7, 8, 9 and 10, a plurality of conductor wires 2 are pulled out from reels 3, which are rotatably held, and the so unwound conductor wires 2 are arranged in parallel (FIG. 7); two pieces of adhesive, insulating tape 4 are applied to the opposite surfaces of parallel arrangement of conductor wires 2 (FIGS. 8 and 9); the parallel arrangement of conductor wires 2 having the rectangular pieces of adhesive, insulating tape 4 applied to its opposite surfaces is cut and removed; and finally the rectangular pieces of adhesive, insulating tape 4 are cut along their opposite ends to expose the opposite ends 5 of the conductor wires 2, which opposite ends 5 will be used as terminal contacts (FIG. 10).

A conventional flat cable 1 thus provided has insufficient flexibility because the integral arrangement of conductor wires 2 of same size is less flexible, and therefore, it cannot be bent to be in a small diameter semicircular shape, thus preventing its use in bridging over a short distance. Also disadvantageously, an extra step is required to cut and remove the opposite ends of the rectangular pieces of adhesive tape applied to the opposite surfaces of the parallel wire arrangement to provide exposed wire terminal lengths. Still disadvantageously, it is difficult to arrange a plurality of wires in parallel with accuracy.

SUMMARY OF THE INVENTION

An object of the present invention is to provide a flat cable whose flexibility is sufficient enough to permit its bending in a small curve, thus permitting desired connection across a relatively short distance.

Another object of the present invention is to provide a method of making such flat cables with ease and accuracy.

To attain these objects a flat cable comprising a plurality of flexible conductor wires arranged parallel with each other and terminal contacts at their opposite ends is improved according to the present invention in that it comprises pieces of adhesive, insulating tapes applied to the opposite sides of the parallel arrangement of conductor wires leaving their opposite ends exposed, thereby permitting the exposed ends to be used as said terminal contacts, each of said conductor wires having an intermediate portion shaped to increase its flexibility.

According to another aspect of the present invention each of said conductor wires has an intermediate length of reduced width.

According to still another aspect of the present invention a method of making flat cables comprises the steps of: preparing an electrically conductive strip having carrier means along its opposite sides; punching said electrically conductive strip to form a plurality of conductor wires laterally arranged in parallel relationship and connected integrally to the opposite edges of said electrically conductive strip, each of said conductor wires having an intermediate length of reduced width; applying two pieces of adhesive, insulating tape to the opposite surfaces of the so punched strip, leaving the opposite ends of the conductor wires exposed; and finally cutting and removing said carrier means.

As each conductive strip has a reduced intermediate length, the parallel arrangement of such conductive strips covered with pieces of insulating tape can be easily bent to form a semicircular shape of reduced diameter, thus permitting a short-distance connection between adjacent electrical units.

Punching is continuously performed on an elongated strip while being fed by using a carrier means along its opposite edges, and therefore, a plurality of parallel-arranged conductor wires can be effectively provided at one time with accuracy. After applying pieces of adhesive, insulating tape to such parallel arrangement of conductor wires with their opposite ends exposed to provide terminal contact portions, and then, the carrier means is finally cut and removed. Advantageously this process requires no cutting-and-removing of tapes from conductor wires after it has once been applied thereto, which is different from a conventional flat tape manufacturing method.

Other objects and advantages of the present invention will be understood from the following description of preferred embodiments of the present invention, which are shown in accompanying drawings.

DESCRIPTION OF THE PREFERRED EMBODIMENTS

Figure 1:
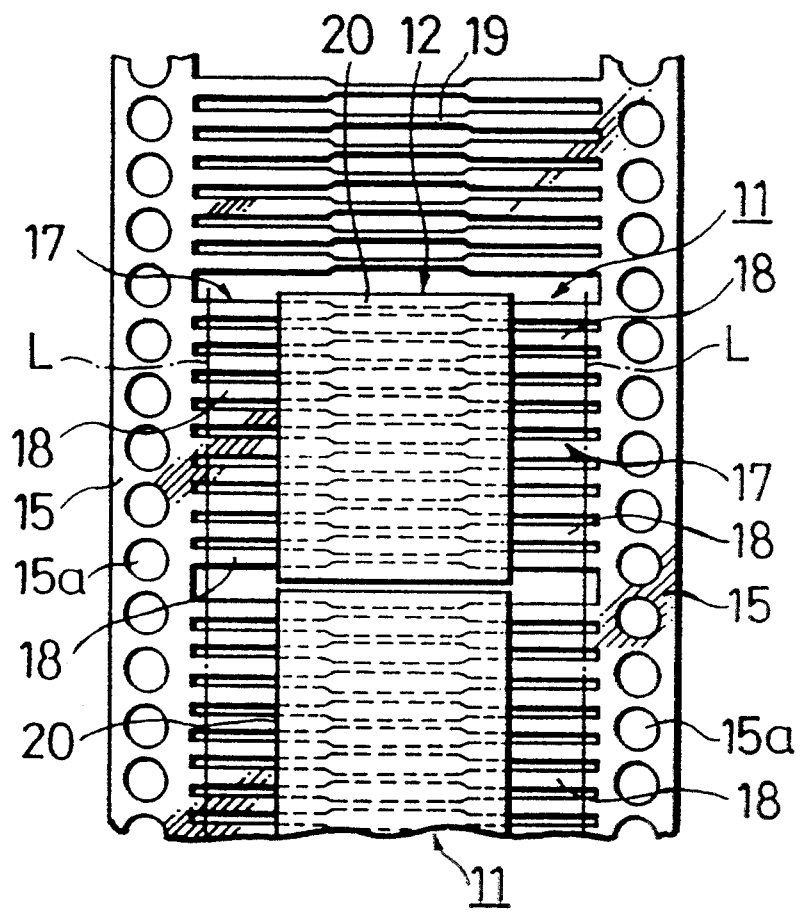
FIG. 1 is a plane view of an elongated strip before cutting and removing carrier means.
Figure 2:
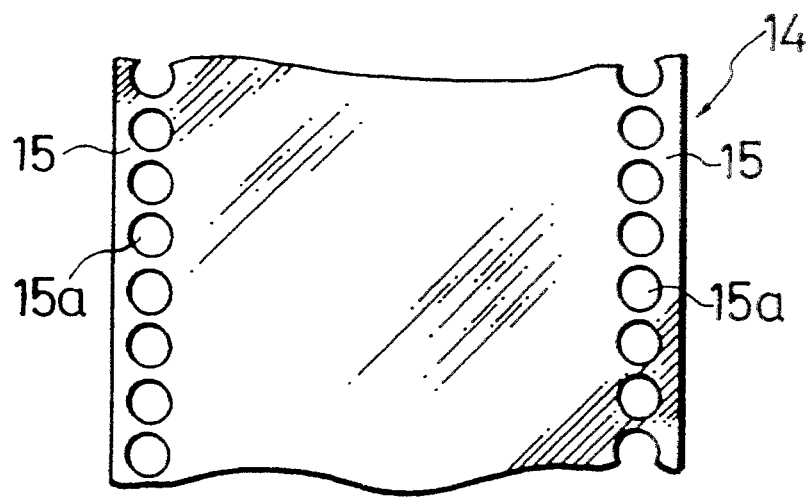
FIG. 2 is a plane view of a fragment of an elongated conductor strip from which a flat cable is made.

Referring to FIG. 1, an elongated strip is shown before cutting and removing its carrier means in the course of making a flat cable 11 according to the present invention. An elongated strip of conductive, flexible metal foil 14, as shown in FIG. 2, has carrier means 15 in the form of a series of feeding perforations 15a on either edge. Such elongated strip 14 is punched, and then the carrier means 15 is cut off and removed from the so punched strip to provide a parallel arrangement of conductor wires 17 each having terminal contact portions 18 at its opposite ends. The parallel assembly of the conductor wires 17 has two pieces of adhesive, insulating tape 20 applied to its opposite center areas as indicated at 12.

Each conductor wire 17 has an intermediate length of reduced width 19 sandwiched between the opposite insulating areas 12. The intermediate length of reduced width 19 has the effect of increasing tile flexibility of the conductor wire, thereby permitting the conductor wire 17 to be easily bent in a semicircular shape of a relatively small radius. As seen in some drawings, each conductor wire 17 has a tapering section 17a at each transient section from either terminal contact portion 18, respectively, to the intermediate length of reduced width 19.

A flame retardant tape which comprises a self-extinguishing polyester film having a self-extinguishing adhesive coating thereon may be used as insulating tape 20 to cover a plurality of conductor wires 17. Two rectangular pieces of such adhesive insulating tape 20 are applied to the opposite center areas of the parallel arrangement of conductor wires 17, thus providing insulation covers 12.

Figure 5:
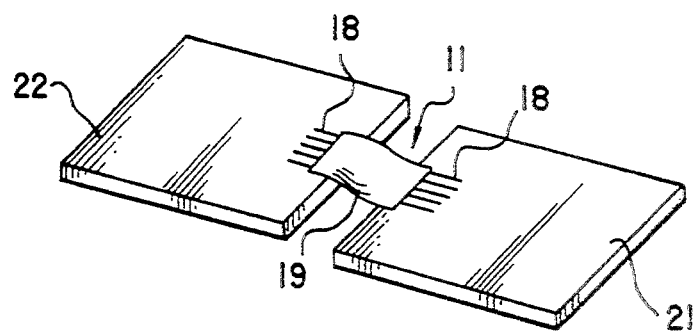
FIG. 5 shows a manner in which a flat cable according to the present invention is used.
Figure 6:
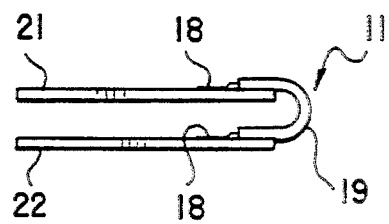
FIG. 6 shows another manner in which a flat cable according to the present invention is used.
Figure 7:
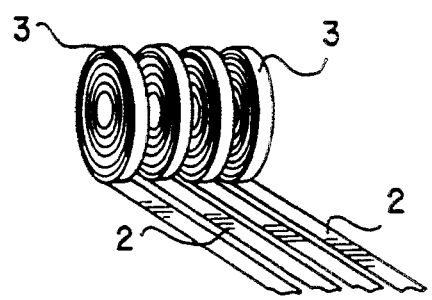
FIG. 7 is a perspective view showing the manner in which a conventional flat cable is made.
Figure 8:
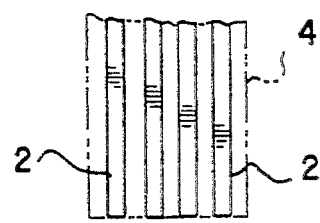
FIG. 8 is a plane view of the conventional flat cable at an intermediate stage.
Figure 9:
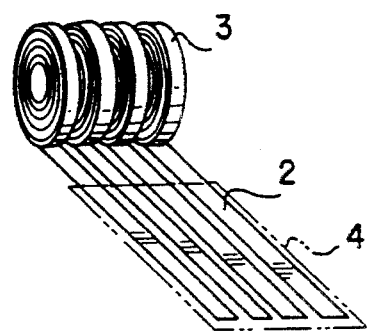
FIG. 9 is a perspective view of the conventional flat cable at another intermediate stage.
Figure 10:
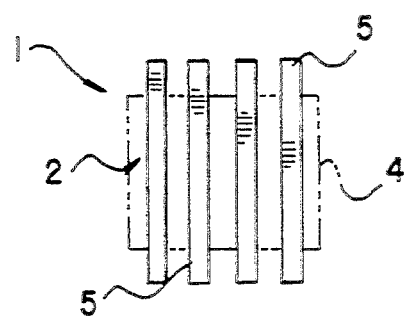
FIG. 10 is a plane view or the conventional flat cable.

FIGS. 5 and 6 show two different manners in which flat cables 11 may be used. Specifically in FIG. 5, a flat cable 11 is used to connect two substrates 21 and 22 laid at different levels by connecting its opposite conductor terminals 18 to associated terminals of these substrates 21 and 22. In FIG. 6, a flat cable 11 is used to connect upper and lower substrates 21 and 22 by connecting its opposite conductor terminals 18 to associated terminals of these upper and lower substrates 21 and 22. In either case the increased flexibility of the flat cable 11 connects two substrates arranged at a short interval.

In FIGS. 5 and 6 the conductor terminals 18 of the flat cables 11 are shown as being soldered to associated terminals of the substrates 21 and 22. The conductor terminals of the flat cable 11 may be increased in strength by attaching reinforcing ribs. Thus, the conductor terminals of the flat cable 11 may be shaped in the form of male plugs. The counter terminals of the substrate may be provided in the form of female receptacles.

Now, the manner in which such flat cables 11 are made according to the present invention is described below.

First, an elongated strip 14 of electrically conductive, flexible metal foil having feeding perforations 15a along its opposite edges is unrolled to be extended as shown in FIG. 2.

Figure 3:
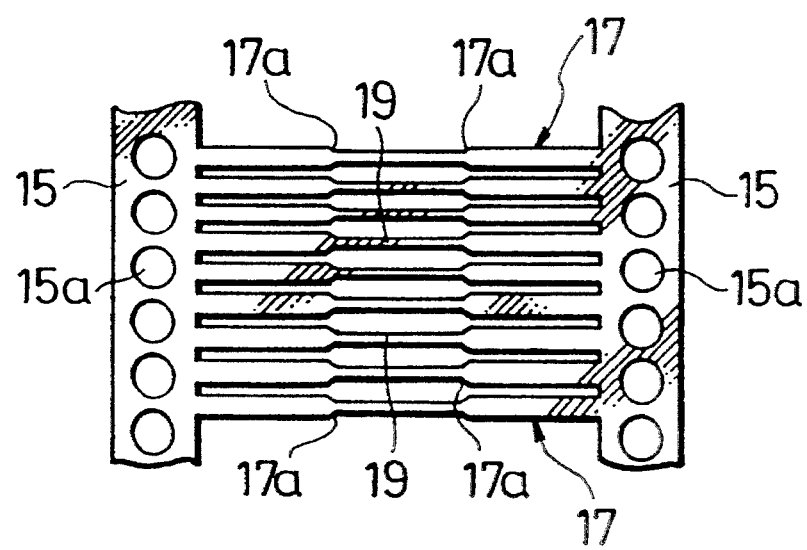
FIG. 3 is a plane view of a fragment of an elongated conductor strip after being punched to provide a plurality of parallel-arranged conductor wires each having a reduced intermediate length.

Second, the elongated strip 14 thus extended is punched to provide conductor wires 17 of the same number and parallel arrangement as the conductor wires 17 of a flat cable 11 to be made, as shown in FIG. 3. In this position the opposite end lengths of the conductor wires 17 remain integrally connected to the opposite carrier edges of the elongated strip, thereby preventing any disordering of the conductor wires 17 in parallel arrangement.

Figure 4:
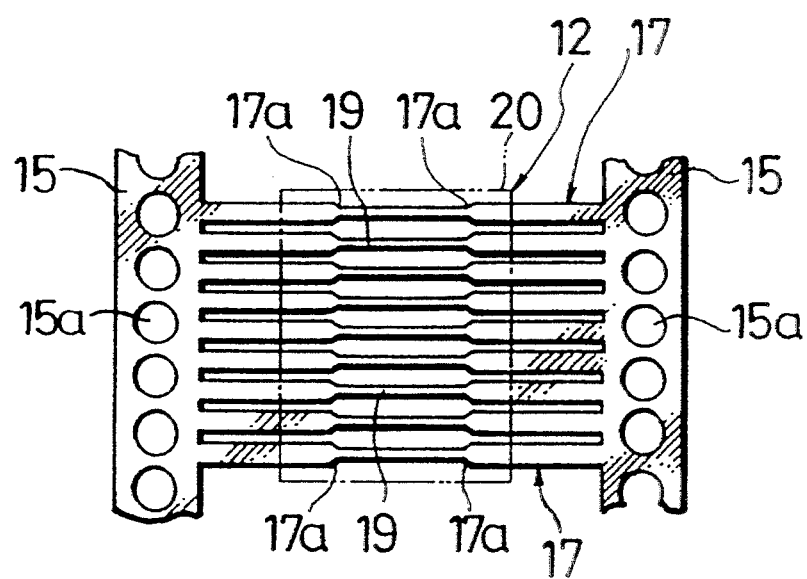
FIG. 4 is a plane view of a fragment of an elongated conductor strip thus punched with pieces of adhesive, insulating tape applied to its opposite surfaces.

Third, two rectangular pieces of adhesive, insulating tapes 20 are applied to the opposite center areas of the parallel conductor wire arrangement 17, leaving the opposite conductor terminal portions 18 exposed, as seen from FIG. 4.

Fourth, after the conductor wires 17 are fixedly positioned by the insulating covers 12, the opposite edges 15 containing feeding perforations 15a are cut along the lines L (FIG. 1), and are removed.

As may be understood from the above, as the elongated strip 14 of electrically conductive, flexible metal foil is being unrolled and fed by using its perforations 15, it is punched at one time to provide conductor wires 17 of the same number and parallel arrangement as a flat cable 11 to be made, and two rectangular pieces of adhesive, insulating tapes 20 are applied to the center areas of the parallel conductor wire arrangement to form insulating covers 12, and finally the opposite perforated edges 15 are cut and removed. This permits flat cables to be made with an increased accuracy at an increased efficiency.

The present invention should not be understood as being limitative to the embodiment described above. A variety of modifications are possible within the scope of the present invention as for instance follows: terminal contacts may be arranged at different intervals; conductor wires may be of different widths to permit the flowing of different quantities of electric current; an elongated strip may be extended long in place of using rolled strip; film material other than polyester may be used as insulating tapes and so forth.

We claim:

1. A flat cable comprising a multiplicity of flexible, substantially parallel conductor wires arranged between two sheets of insulating material which cover only a portion of said wires leaving the opposite ends of said wires exposed; wherein said wires comprise two end portions and an intermediate portion between these end portions which is of reduced width as compared to said end portions and is of greater flexibility than said end portions, including the exposed ends, thereof; and wherein said intermediate portions of said wires are covered by said insulating material.

2. A method of making flat cables comprising the steps of:
   preparing an electrically conductive strip having carrier means along its opposite sides;
   punching said electrically conductive strip to form a plurality of conductor wires laterally arranged in parallel and connected integrally to the opposite sides of said electrically conductive strip, each of said conductor wires having an intermediate length of reduced width;
   applying two pieces of adhesive, insulating tapes to the opposite surfaces of the so punched strip, leaving the opposite ends of the conductor wires exposed; and finally
   cutting and removing said carrier means.

* * * * *